United States Patent
Akamatsu et al.

(10) Patent No.: US 11,143,950 B2
(45) Date of Patent: Oct. 12, 2021

(54) MASK MANUFACTURING METHOD AND MASK SET

(71) Applicant: TOSHIBA MEMORY CORPORATION, Tokyo (JP)

(72) Inventors: Yuki Akamatsu, Yokkaichi Mie (JP); Nobuhiro Komine, Nagoya Aichi (JP); Takashi Koike, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 449 days.

(21) Appl. No.: 15/907,459

(22) Filed: Feb. 28, 2018

(65) Prior Publication Data

US 2019/0079386 A1 Mar. 14, 2019

(30) Foreign Application Priority Data

Sep. 8, 2017 (JP) .............................. JP2017-173449

(51) Int. Cl.
*G03F 1/42* (2012.01)
*G03F 1/70* (2012.01)
*H01L 21/027* (2006.01)

(52) U.S. Cl.
CPC .................. *G03F 1/42* (2013.01); *G03F 1/70* (2013.01); *H01L 21/0276* (2013.01)

(58) Field of Classification Search
CPC ................. G03F 1/42; G03F 1/46; G03F 1/72
See application file for complete search history.

(56) References Cited

U.S. PATENT DOCUMENTS

| 5,780,187 A * | 7/1998 | Pierrat .................. G03F 1/72 430/324 |
| 6,108,096 A * | 8/2000 | Ushio ................. G01N 21/1702 356/432 |
| 2002/0191310 A1* | 12/2002 | Weigl ...................... G02B 5/208 359/885 |

FOREIGN PATENT DOCUMENTS

| JP | H07-043889 A | 2/1995 |
| JP | 2009-162851 A | 7/2009 |

* cited by examiner

*Primary Examiner* — Daborah Chacko-Davis
(74) *Attorney, Agent, or Firm* — Foley & Lardner LLP

(57) ABSTRACT

A mask manufacturing method includes stacking a first antireflection layer on a first stacked body at a first film thickness so as to create a first transmissive type mask. In the first stacked body, a first semitransmissive layer, a first reflective layer, and a first transmissive substrate are stacked. The mask manufacturing method includes stacking a second antireflection layer on a second stacked body at a second film thickness so as to create a second transmissive type mask. In the second stacked body, a second semitransmissive layer, a second reflective layer, and a second transmissive substrate are stacked. The second film thickness is determined in accordance with a thermal expansion amount of the first mask.

3 Claims, 6 Drawing Sheets

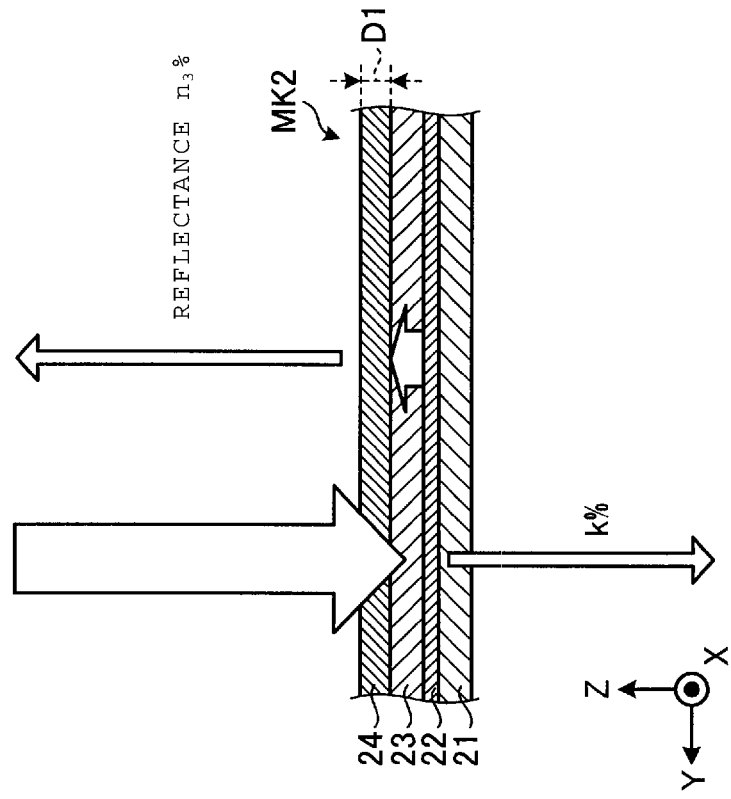
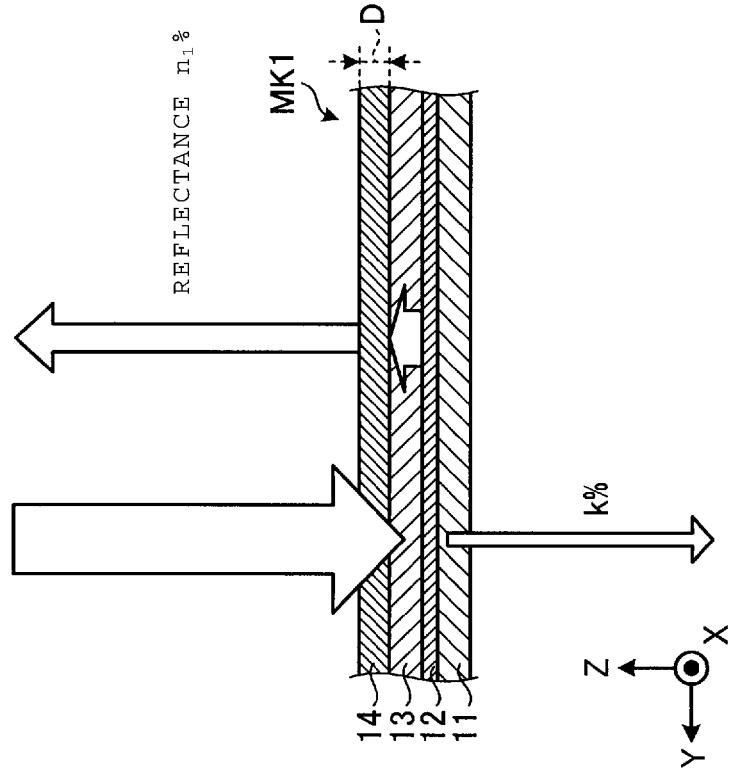

US 11,143,950 B2

MASK MANUFACTURING METHOD AND MASK SET

CROSS-REFERENCE TO RELATED APPLICATION

This application claims the benefit of and priority to Japanese Patent Application No. 2017-173449, filed Sep. 8, 2017, the entire contents of which are incorporated herein by reference.

FIELD

Embodiments described herein relate generally to a mask manufacturing method and a mask set.

BACKGROUND

In a manufacturing process of a semiconductor device, exposure processing of transferring a pattern of a mask onto a resist on a working target film so as to form a resist pattern is repeated. At this time, it is desirable to have overlapping precision between a plurality of masks which are respectively used in different pieces of exposure processing.

DESCRIPTION OF THE DRAWINGS

FIGS. 4A and 4B are diagrams illustrating reflectance of two masks in some embodiments.

DETAILED DESCRIPTION

Figure 1A:
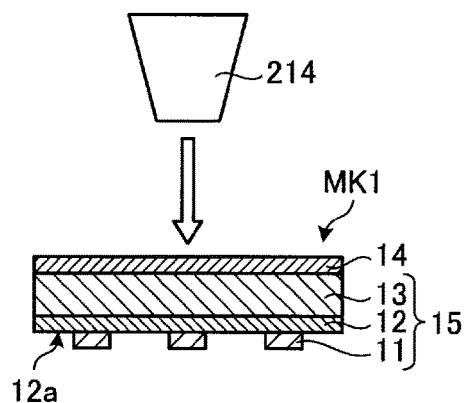
FIGS. 1A to 1F are diagrams illustrating a difference of a thermal expansion amount between two masks in some embodiments.

Exemplary embodiments provide a mask manufacturing method and a mask set that can improve overlapping precision between a plurality of masks.

According to some embodiments, there is provided a mask manufacturing method. The mask manufacturing method includes stacking a first antireflection layer on a first stacked body at a first film thickness so as to create a first transmissive type mask. In the first stacked body, a first semitransmissive layer, a first reflective layer, and a first transmissive substrate are stacked. The mask manufacturing method includes stacking a second antireflection layer on a second stacked body at a second film thickness so as to create a second transmissive type mask. In the second stacked body, a second semitransmissive layer, a second reflective layer, and a second transmissive substrate are stacked. The second film thickness is determined in accordance with a thermal expansion amount of the first mask.

Hereinafter, a mask manufacturing method according to an embodiment is described with reference to the accompanying drawings. The present invention is not limited to the exemplary embodiments disclosed.

Embodiment

The mask manufacturing method according to some embodiments is applied to a manufacturing process of a semiconductor device. In the manufacturing process of a semiconductor device, a semiconductor device is manufactured in a manner where a plurality of working target films are deposited on a substrate by repeating a cycle a plural number of times which includes exposure processing, working processing, washing processing, and film formation processing.

For example, in exposure processing EX1, a mask MK1 is exposed by a lighting optical system 214. A pattern PT1 of the mask MK1 is transferred onto a resist RS1 on a working target film FL1. Then, developing is performed, and thereby a resist pattern PR1 is formed. In working processing ET1, etching is performed on the working target film FL1 by using the resist pattern RP1 as a mask. In washing processing CL1, the resist RS1 is removed from the working target film FL1. In film formation processing DP1, another working target film is deposited on the working target film FL1.

Similarly, in exposure processing EX2, a mask MK2 is exposed by the lighting optical system 214. A pattern PT2 of the mask MK2 is transferred onto a resist RS2 on a working target film FL2 and developing is performed. Thus, a resist pattern RP2 is formed. In working processing ET2, etching is performed on the working target film FL2 by using the resist pattern RP2 as a mask. In washing processing CL2, the resist RS2 is removed from the working target film FL2. In film formation processing DP2, another working target film is deposited on the working target film FL2.

Among a cycle CY1 which includes the exposure processing EX1, the working processing ET1, the washing processing CL1, and the film formation processing DP1, and a cycle CY2 which includes the exposure processing EX2, the working processing ET2, the washing processing CL2, and the film formation processing DP2, one cycle may be performed after another cycle. In order to increase manufacturing yield of a semiconductor device, it is desirable to improve overlapping precision between a plurality of masks MK1 and MK2 which are respectively used in the different pieces of exposure processing EX1 and EX2.

In an exposure device used in exposure processing (for example, exposure processing EX1 and EX2) for each cycle, a portion of exposure light is converted into heat, and thus a mask (for example, masks MK1 and MK2) may be thermally expanded. Thus, a planar shape (shot distortion shape) of the mask may be changed with time, and overlapping precision of masks during a period between the different pieces of exposure processing may be degraded.

To address these issues, a method involving performing correction in the exposure device by changing a correction value with time may be considered. However, since shape correction which is allowed in the exposure device is limited, it may not be possible to ignore a correction residue of exposure processing in which thermal expansion is large. That is, a method which may replace shape correction in the exposure device or may supplement correction residue is desired.

Thus, in the embodiment, misalignment between the masks MK1 and MK2 is prevented by manufacturing the masks MK1 and MK2 which are respectively used in the different pieces of exposure processing while adjusting reflectance of light.

Specifically, misalignment between the masks MK1 and MK2 may occur by a difference of a thermal expansion amount between the masks MK1 and MK2, as illustrated in FIGS. 1A to 1F. FIGS. 1A to 1F are diagrams illustrating a difference of the thermal expansion amount between the two masks MK1 and MK2. In FIGS. 1A to 1F, a direction perpendicular to the surface of each of the masks MK1 and MK2 is set to a Z-direction, and two directions which are orthogonal to each other in a plane perpendicular to the Z-direction are set to an X-direction and a Y-direction.

Figure 1B:
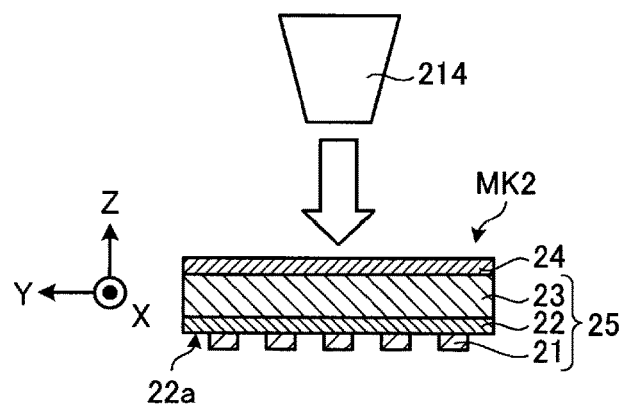

As illustrated in FIG. 1A, in the mask MK1, an antireflection layer 14 is stacked on a stacked body 15 in which a semitransmissive layer 11, a reflective layer 12, and a transmissive substrate 13 are stacked. As illustrated in FIG. 1B, in the mask MK2, an antireflection layer 24 is stacked on a stacked body 25 in which a semitransmissive layer 21, a reflective layer 22, and a transmissive substrate 23 are stacked. The stacked body 15 and the stacked body 25 have configurations which are equivalent to each other. That is, the semitransmissive layer 11 and the semitransmissive layer 21 have film thicknesses which are equivalent to each other, and compositions which are equivalent to each other, respectively. Each of the semitransmissive layer 11 and the semitransmissive layer 21 may be configured with a Si3N4 film, for example. The reflective layer 12 and the reflective layer 22 have film thicknesses which are equivalent to each other, and compositions which are equivalent to each other, respectively. Each of the reflective layer 12 and the reflective layer 22 may be configured with a SiNx film, for example. The transmissive substrate 13 and the transmissive substrate 23 have film thicknesses which are equivalent to each other, and compositions which are equivalent to each other, respectively. Each of the transmissive substrate 13 and the transmissive substrate 23 may be formed of a material in which glass or quartz is provided as the main component.

Each of the masks MK1 and MK2 is a transmissive type mask. The masks MK1 and MK2 respectively include the reflective layer 12 and the reflective layer 22, and thus achieve low thermal expansivity by preventing absorption of heat converted from exposure light. If the reflectance of light in the masks MK1 and MK2 is set to be adjusted by the reflective layer 12 and the reflective layer 22, changing the film type of the reflective layer 12 and the reflective layer 22 is required. Every selectable film type, however, is not provided, and thus it is difficult to adjust the reflectance to have any value.

Therefore, it is desired that the thermal expansion amounts of the masks MK1 and MK2 are approximate to each other in a manner that the antireflection layer 14 and the antireflection layer 24 are respectively provided in the masks MK1 and MK2, and the film thickness thereof is adjusted.

The antireflection layer 14 and the antireflection layer 24 have compositions which are equivalent to each other. The antireflection layer 14 may be formed of a material having a refractive index which causes a difference of a refractive index between the antireflection layer 14 and the transmissive substrate 13 to be smaller than a difference of a refractive index between the reflective layer 12 and the transmissive substrate 13. The antireflection layer 24 may be formed of a material having a refractive index which causes a difference of a refractive index between the antireflection layer 24 and the transmissive substrate 23 to be smaller than a difference of a refractive index between the reflective layer 22 and the transmissive substrate 23.

Figure 1C:
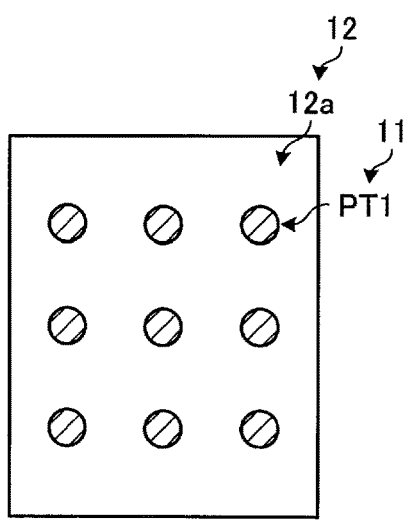
Figure 1D:
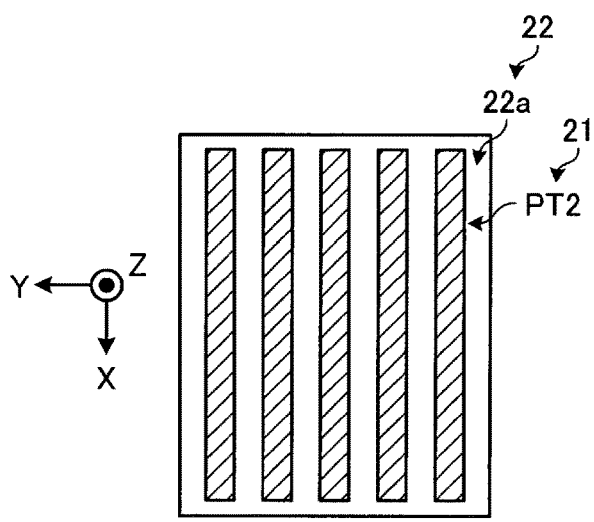
Figure 1E:
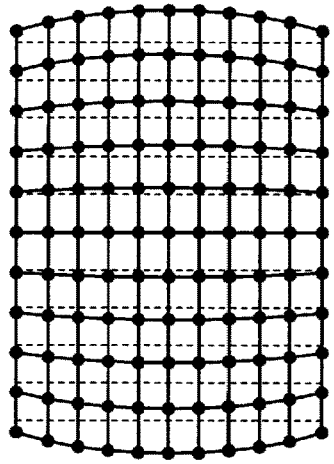
Figure 1F:
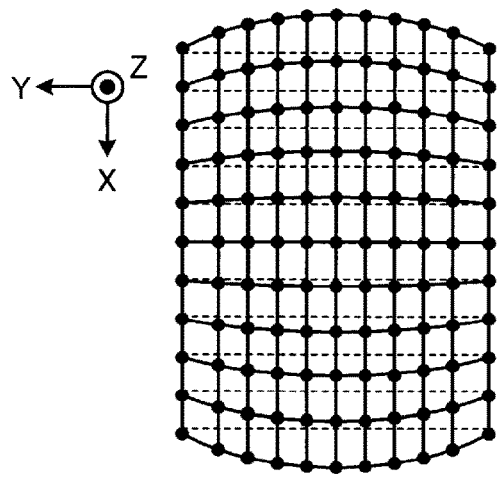

For example, even if the antireflection layer 14 and the antireflection layer 24 has a film thickness of D1 and compositions which are equivalent to each other, if exposure amounts of the masks MK1 and MK2 are different from each other as illustrated in FIGS. 1A and 1B, or a coverage of the pattern PT1 of the semitransmissive layer 11 is different from a coverage of the pattern PT2 of the semitransmissive layer 21 as illustrated in FIGS. 1C and 1D, thermal expansion amounts of the masks MK1 and MK2 may be different from each other as illustrated in FIGS. 1E and 1F. In FIGS. 1E and 1F, for simple illustrations, the thermal expansion amount in the X-direction is selectively illustrated. However, in practice, the thermal expansion amount may be provided in an XY plane.

Figure 2:
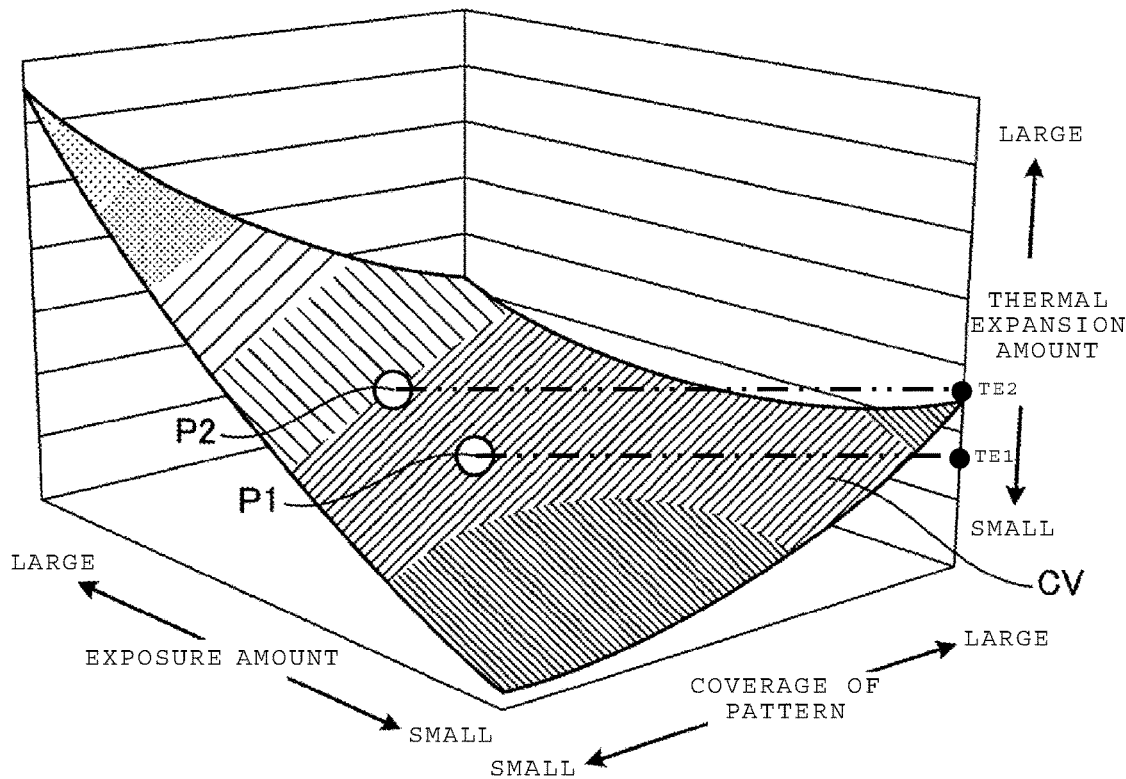
FIG. 2 is a graph illustrating a relationship between an exposure amount, a coverage of a pattern, and a thermal expansion amount thereof in some embodiments.

As illustrated in FIG. 2, a difference of the thermal expansion amount between the masks MK1 and MK2 can be quantitatively obtained by simulation. FIG. 2 is a graph illustrating a relationship between the exposure amount, the coverage of the pattern, and the thermal expansion amount. FIG. 2 illustrates a curved surface (for example, two-dimensional curved surface) CV indicating a relationship between the exposure amount, the coverage of the pattern, and the thermal expansion amount in a case where the film thickness of the antireflection layer 14 and the film thickness of the antireflection layer 24 are D1 together, as an example. That is, if a point P1 corresponding to design values of the exposure amount for the mask MK1 and the coverage of the pattern PT1 is plotted on the curved surface CV, the thermal expansion amount of the mask MK1 can be predicted to be TE1 on the curved surface CV. Similarly, if a point P2 corresponding to design values of the exposure amount for the mask MK2 and the coverage of the pattern PT2 is plotted on the curved surface CV, the thermal expansion amount of the mask MK2 can be predicted to be TE2 on the curved surface CV.

For example, the mask MK1 among the masks MK1 and MK2 may be set as a reference mask. In order to reduce or minimize the difference of the thermal expansion amount between the masks MK1 and MK2, the thermal expansion amount of the mask MK2 is adjusted based on an expression of $\Delta TE2 = TE2 - TE1$.

Figure 3:
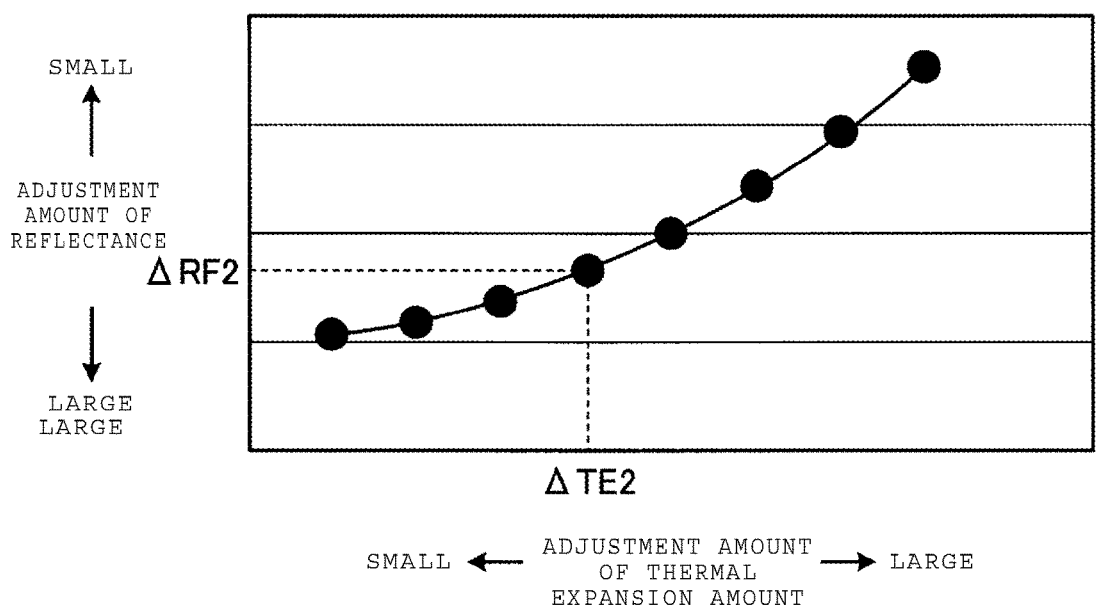
FIG. 3 is a graph illustrating a relationship between an adjustment amount of the thermal expansion amount and an adjustment amount of reflectance in some embodiments.

As illustrated in FIG. 3, the degree of the reflectance of light being allowed to be adjusted with respect to the adjustment amount of the thermal expansion amount can be obtained experimentally in advance. FIG. 3 is a graph illustrating a relationship between an adjustment amount of the thermal expansion amount and an adjustment amount of the reflectance. The adjustment amount of the reflectance relative to the adjustment amount $\Delta TE2$ of the thermal expansion amount is $\Delta RF2$, based on the relationship between the adjustment amount of the thermal expansion amount and the adjustment amount of the reflectance illustrated in FIG. 3.

In a case where the configurations of the stacked bodies 15 and 25 are the same as those illustrated in FIGS. 1A and 1B, the reflectance of each of the masks MK1 and MK2 can be obtained by simulation, as illustrated in FIGS. 4A and 4B. FIGS. 4A and 4B are diagrams illustrating the reflectance of the two masks MK1 and MK2. As illustrated in FIG. 4A, in the mask MK1, in a case where the film thickness of the antireflection layer 14 is D1, the reflectance is calculated as n1%. As illustrated in FIG. 4B, in the mask MK2, in a case where the film thickness of the antireflection layer 24 is D1, the reflectance is calculated as n3%. At this time, light emitted from each of the semitransmissive layers 11 and 21 toward the substrate is set to be k %. The semitransmissive layers 11 and 21 in the masks MK1 and MK2 cover portions of the rear surfaces 12a and 22a of the reflective layers 12 and 22, on which the patterns PT1 and PT2 are provided, respectively (see FIGS. 1A and 1B). However, for simple illustrations, FIGS. 4A and 4B illustrate that the semitransmissive layers 11 and 21 cover the entirety of the rear surfaces 12a and 22a of the reflective layers 12 and 22.

Figure 5:
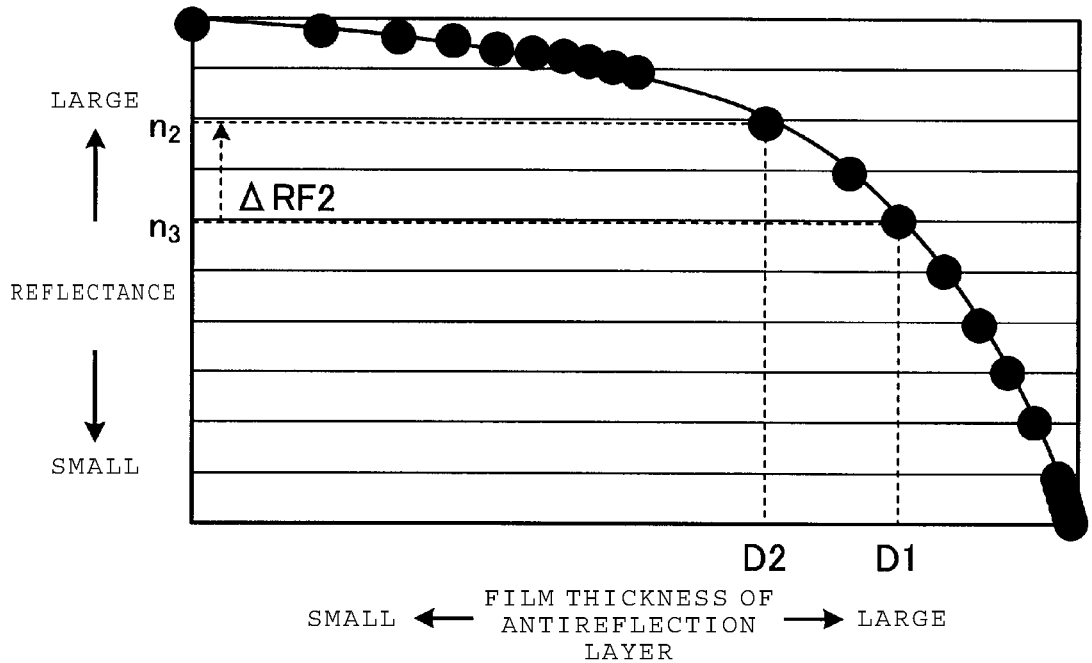
FIG. 5 is a graph illustrating a relationship between a film thickness of an antireflection layer of the mask and the reflectance of the mask in some embodiments.

In a case where the configurations of the stacked bodies 15 and 25 are the same as those illustrated in FIGS. 1A and 1B, the value of the reflectance of light for each film thickness of the antireflection layer can be obtained experimentally in advance, as illustrated in FIG. 5. FIG. 5 is a graph illustrating a relationship between the film thickness of the antireflection layer of the mask and the reflectance of the mask. The reflectance of light with respect to the design film thickness D1 of the current antireflection layer 24 is n3% obtained by simulation, based on the relationship (illustrated in FIG. 5) between the film thickness of the antireflection layer and the reflectance. Thus, the film thickness corresponding to the reflectance n2% (=n3+ΔRF2) obtained by adding the adjustment amount ΔRF2 of the reflectance to the current reflectance n3% can be obtained as D2. That is, the film thickness D2 which may be adjusted with respect to the design film thickness D1 of the current antireflection layer 24 can be obtained by referring to the relationship (illustrated in FIG. 5) between the film thickness of the antireflection layer and the reflectance.

Figure 6:
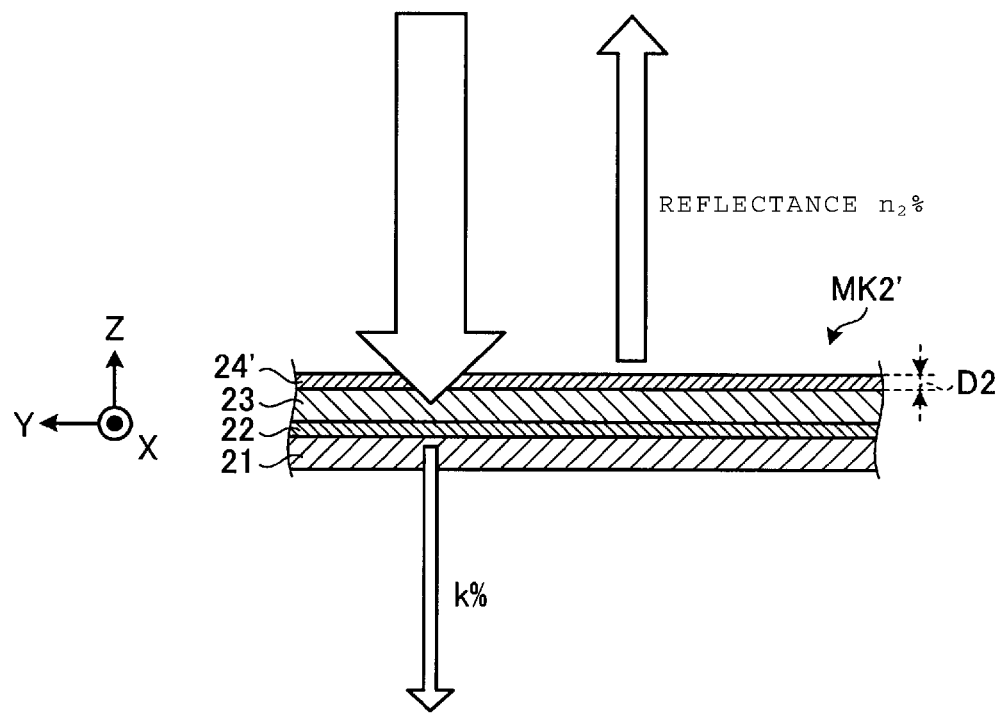
FIG. 6 is a diagram illustrating a mask after adjustment, in some embodiments.

Accordingly, as illustrated in FIG. 6, the film thickness of an antireflection layer 24' can be adjusted to be D2 and the design value of a mask MK2' after adjustment can be obtained. FIG. 6 is a diagram illustrating the mask MK2' after adjustment. Then, the mask MK1 can be manufactured in accordance with the design value, and mask MK2' can be manufactured in accordance with the design value after adjustment as illustrated in FIG. 6. Thus, performing exposure processing EX1 and EX2 using the masks MK1 and MK2' makes it possible to improve overlapping precision between the masks MK1 and MK2'.

Figure 7:
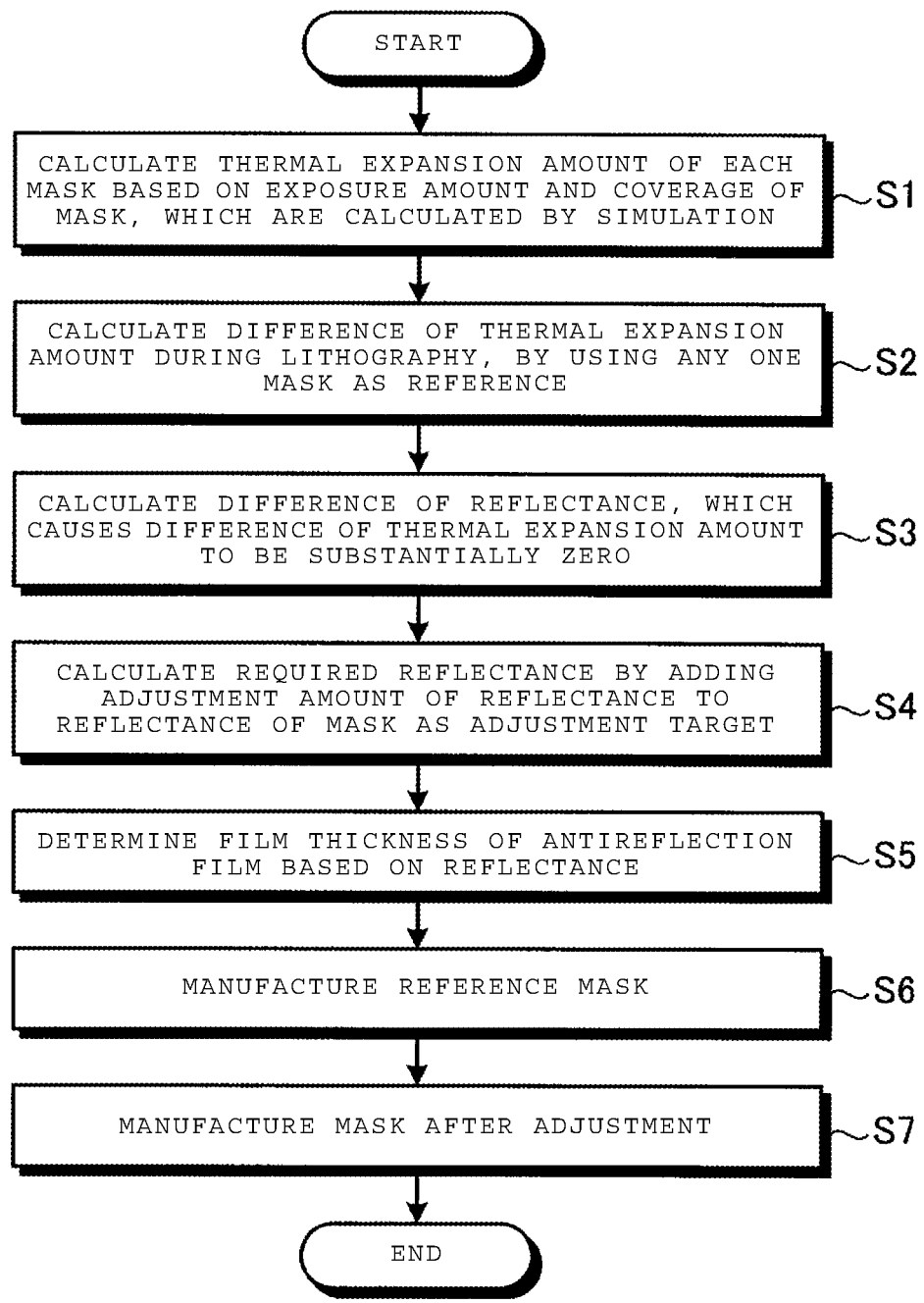
FIG. 7 is a flowchart illustrating a mask manufacturing method according to some embodiments.

Next, the mask manufacturing method will be described with reference to FIG. 7. FIG. 7 is a flowchart illustrating the mask manufacturing method.

The thermal expansion amount of each of the masks is calculated based on the exposure amount of the corresponding mask and the coverage of the pattern, by using a simulation result (see FIG. 2) of a relationship between the exposure amount, the coverage of the pattern, and the thermal expansion amount (S1). A difference of the thermal expansion amount during lithography (for example, between the exposure processing EX1 and EX2) is calculated by using any one mask (for example, mask MK1) as a reference (S2). The adjustment amount of the reflectance, which causes a difference of the thermal expansion amount to be substantially zero is calculated by using the relationship (see FIG. 3) between the adjustment amount of the thermal expansion amount and the adjustment amount of the reflectance (S3). Required reflectance is calculated by adding the adjustment amount of the reflectance to the reflectance of a mask as an adjustment target (S4). The film thickness of the antireflection layer, which is to be adjusted is determined based on the required reflectance, by using the relationship (see FIG. 5) between the film thickness of the antireflection layer of the mask and the reflectance of the mask (S5). The reference mask (for example, mask MK1) is manufactured in accordance with the design value (S6). The mask (for example, mask MK2) as the adjustment target is manufactured in accordance with the design value after the adjustment (S7).

As described above, in the embodiment, the masks MK1 and MK2 which are respectively used in the different pieces of exposure processing are manufactured while the light reflectance is adjusted. Specifically, the antireflection layer 14 is stacked on the stacked body 15 in which the semitransmissive layer 11, the reflective layer 12, and the transmissive substrate 13 are stacked, at the film thickness D1 so as to create the transmissive type mask MK1. The antireflection layer 24 is stacked on the stacked body 25 in which the semitransmissive layer 21, the reflective layer 22, and the transmissive substrate 23 are stacked, at the film thickness D2 determined in accordance with the thermal expansion amount of the mask MK1, so as to create the transmissive type mask MK2'. Thus, the thermal expansion amounts of the masks MK1 and MK2' can be made equivalent to each other, and prevent misalignment between the masks MK1 and MK2'. Accordingly, it is possible to improve overlapping precision between a plurality of masks which are respectively used in different pieces of exposure processing.

In the embodiment, a case where a reference mask among the two masks MK1 and MK2 is set to be a mask having a smaller thermal expansion amount is described as an example. However, even in a case where the reference mask is set to be a mask having a greater thermal expansion amount, it is also possible to achieve an effect which is similar to that in the embodiment.

The embodiment can be applied even in a case where film thicknesses of antireflection layers in two masks before adjustment are different from each other, so long as the relationship (illustrated in FIG. 2) between the exposure amount, the coverage of the pattern, and the thermal expansion amount can be acquired for each of the film thicknesses of the antireflection layers.

Figure 8:
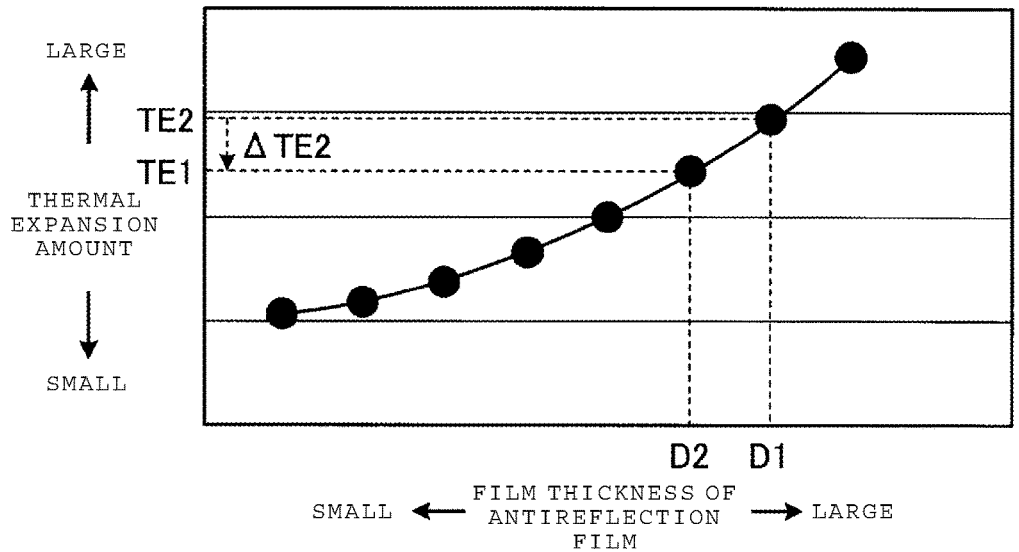
FIG. 8 is a graph illustrating a relationship between a film thickness of an antireflection film of a mask and a thermal expansion amount of the mask in a modification example of some embodiments.

Alternatively, as illustrated in FIG. 8, in a case where the relationship between the film thickness of an antireflection film of the mask and the thermal expansion amount, the thermal expansion amount of the mask may be adjusted without adjusting the reflectance of light. FIG. 8 illustrates a relationship between the film thickness of the antireflection film of the mask and the thermal expansion amount of the mask. That is, it can be confirmed that the thermal expansion amount of the mask MK2 as an adjustment target with respect to the design film thickness D1 of the current antireflection layer 24 is TE2, based on the relationship (illustrated in FIG. 8) between the film thickness of the antireflection film and the thermal expansion amount of the mask. Thus, the film thickness corresponding to the thermal expansion amount TE1 (=TE2+ΔTE2) obtained by adding the adjustment amount ΔTE2 of the thermal expansion amount to the current thermal expansion amount TE2 can be obtained as D2. That is, the film thickness D2 which is to be adjusted with respect to the design film thickness D1 of the current antireflection layer 24 can be obtained by referring to the relationship (illustrated in FIG. 8) between the film thickness of the antireflection film and the thermal expansion amount.

Figure 9:
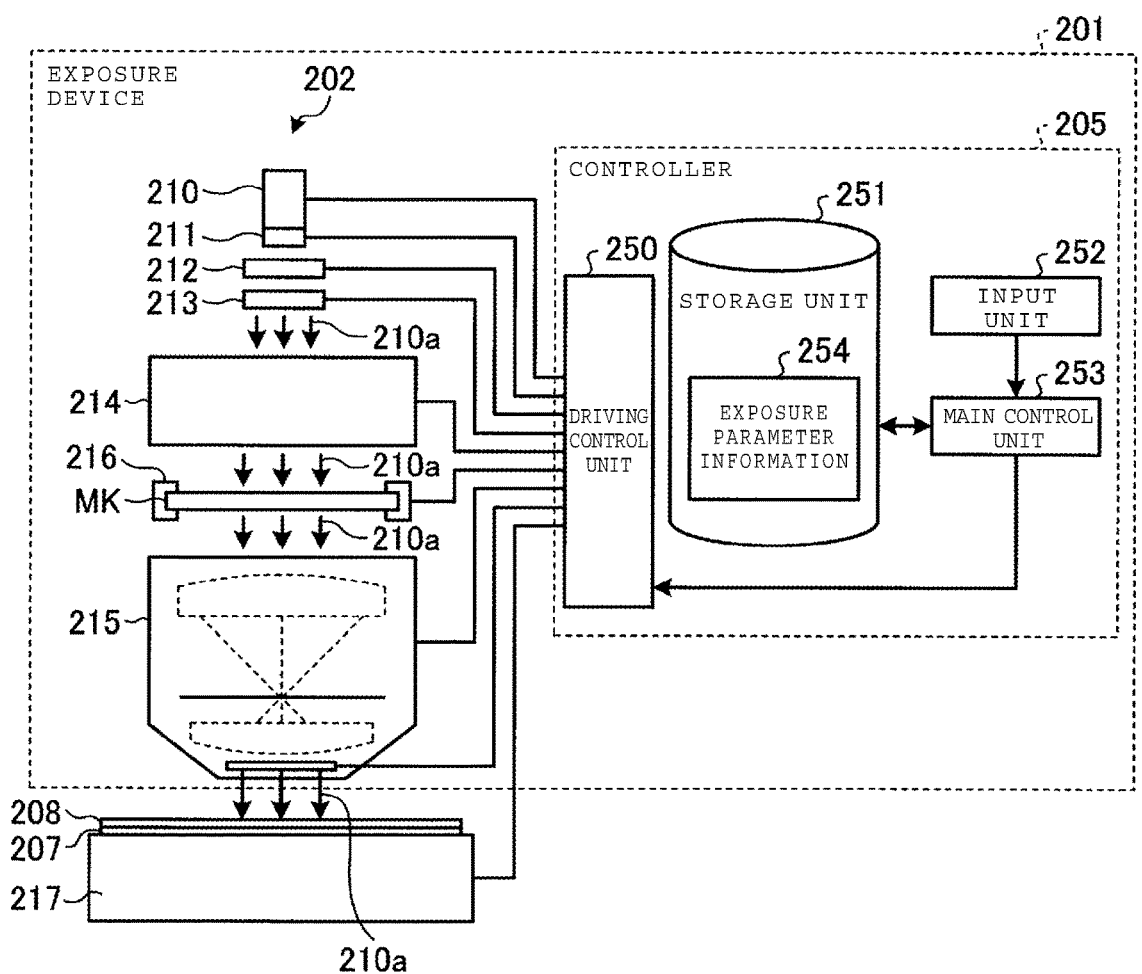
FIG. 9 is a diagram illustrating a configuration of an exposure device that performs exposure processing by using a mask which is manufactured by using the mask manufacturing method according to some embodiments.

Next, a configuration of an exposure device 201 that performs exposure processing by using masks (masks MK1 and MK2') which are created in the above-described manner will be described with reference to FIG. 9. FIG. 9 is a diagram illustrating a configuration of an exposure device 201.

The exposure device 201 includes an exposure-device main body 202 and a controller/processor 205. The controller 205 includes an input unit 252, a main control unit 253, a storage unit 251, and a driving control unit 250. The main control unit 253 receives an input of an exposure parameter (for example, exposure amount or focus value) via the input unit 252 and causes the storage unit 251 to store the input exposure parameter as exposure parameter information 254. The main control unit 253 controls units of the exposure-device main body 202 via the driving control unit 250, based on the exposure parameter information 254.

The exposure-device main body 202 includes a light source 210, an aperture diaphragm 211, a filter 212, a polarizing filter 213, a lighting optical system 214, a projection optical system 215, a mask stage 216, and a substrate stage 217. The mask stage 216 holds a mask MK. The substrate stage 217 holds a substrate 207.

The aperture diaphragm 211 has a substantially disc shape, for example. The aperture diaphragm 211 has a light emitting region (illumination region) and a non-light emitting region (illumination shielding region). The non-light emitting region is a region in which exposure light 210a emitted from the light source 210 is shielded. The light emitting region is a region in which exposure light 210a emitted from the light source 210 is transmitted. That is, regarding the aperture diaphragm 211, an illumination shape is adjusted. Accordingly, illumination light is emitted by the lighting optical system 214, and the mask MK causes a latent image to be formed on a photosensitive material (for example, resist) 208 on the substrate 207, via the projection optical system 215.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A mask manufacturing method comprising:
   providing a first mask including a first antireflection layer, at a first film thickness, stacked on a first pattern layer, a first reflective layer, and a first transmissive substrate;
   providing a second mask including a second antireflection layer, at a second film thickness, stacked on a second pattern layer, a second reflective layer, and a second transmissive substrate, wherein the second pattern layer has a thickness and component equivalent to the first pattern layer but has a different pattern than the first pattern layer, wherein the second reflective layer has a thickness and component equivalent to the first reflective layer, and wherein the second transmissive substrate has a thickness and component equivalent to the first transmissive substrate;
   calculating a first thermal expansion amount of the first mask from a first exposure amount in a first process;
   calculating a second thermal expansion amount of the second mask from a second exposure amount in a second process;
   adjusting the first film thickness and the second film thickness until a difference between the first thermal expansion amount and the second thermal expansion amount is reduced;
   fabricating the first mask including the first antireflection layer, at an adjusted first film thickness, stacked on the first pattern layer, the first reflective layer, the first transmissive substrate; and
   fabricating the second mask including the second antireflection layer, at an adjusted second film thickness, stacked on the second pattern layer, the second reflective layer, the second transmissive substrate.

2. The mask manufacturing method according to claim 1, wherein a first body and a second body have layer thicknesses which are the same with each other, the first body including: the first pattern layer, the first reflective layer, and the first transmissive substrate, the second body including: the second pattern layer, the second reflective layer, and the second transmissive substrate, and
   wherein the second thermal expansion amount of the second mask is substantially equal to the first thermal expansion amount of the first mask.

3. The mask manufacturing method according to claim 1, wherein a first body and a second body have layer compositions which are the same with each other, the first body including: the first pattern layer, the first reflective layer, and the first transmissive substrate, the second body including: the second pattern layer, the second reflective layer, and the second transmissive substrate, and
   wherein the second thermal expansion amount of the second mask is substantially equal to the first thermal expansion amount of the first mask.

* * * * *